(12) United States Patent
Benwadih et al.

(10) Patent No.: US 8,450,217 B2
(45) Date of Patent: May 28, 2013

(54) METHOD FOR MAKING HOLES USING A FLUID JET

(75) Inventors: Mohamed Benwadih, Champigny-sur-Marne (FR); Marie Heitzmann, Sinard (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/519,265

(22) PCT Filed: Dec. 22, 2010

(86) PCT No.: PCT/FR2010/000865
§ 371 (c)(1),
(2), (4) Date: Jun. 26, 2012

(87) PCT Pub. No.: WO2011/080419
PCT Pub. Date: Jul. 7, 2011

(65) Prior Publication Data
US 2012/0289045 A1     Nov. 15, 2012

(30) Foreign Application Priority Data
Jan. 4, 2010 (FR) .................................... 10 00006

(51) Int. Cl.
*H01L 21/302* (2006.01)
*H01L 21/461* (2006.01)
*H01L 21/44* (2006.01)

(52) U.S. Cl.
USPC .................... 438/745; 438/674; 257/E21.159

(58) Field of Classification Search
USPC .......................... 438/745, 645; 257/E21.159
See application file for complete search history.

(56) References Cited

U.S. PATENT DOCUMENTS

| 6,403,397 | B1 | 6/2002 | Katz |
| 2006/0024859 | A1 | 2/2006 | Wu et al. |
| 2006/0207970 | A1 | 9/2006 | Dunn et al. |
| 2008/0113466 | A1 | 5/2008 | Moriya et al. |

OTHER PUBLICATIONS

Kawase, Takeo et al., *Inkjet Printed Via-Hole Interconnections and Resistors for All-Polymer Transistor Circuits*, Advanced Materials, vol. 13, No. 21, Nov. 2, 2001, pp. 1601-1605.

*Primary Examiner* — David S Blum
(74) *Attorney, Agent, or Firm* — Oliff & Berridge, PLC

(57) ABSTRACT

The method for making a hole in a layer includes the provision of first and second adhesion areas on a surface of a support. The first area has dimensions corresponding to the dimensions of the hole. The method includes depositing a layer on the first and second adhesion areas. The material of the layer has an adhesion coefficient to the first area lower than the adhesion coefficient to the second area. The part of layer arranged above the first area is eliminated by a fluid jet.

8 Claims, 2 Drawing Sheets

METHOD FOR MAKING HOLES USING A FLUID JET

TECHNICAL FIELD OF THE INVENTION

The invention relates to a method for making a hole into a layer. In particular, the invention relates to the production of interconnection vias into devices made from organic materials.

STATE OF THE ART

The continue increase in the performance of integrated circuits, for example in terms of consumption and/or operating frequency, ineluctably results in a constant reduction in the size of their components. The section and the pitch of the metal tracks interconnecting these components also decrease, involving an increase in the propagation delay of the signals.

The interconnections are traditionally carried out by deposition of a conducting layer, photolithography then etching of the conducting layer. This technique is widely used in the case of monolayer circuits, with metal tracks of aluminum for example. In the case of multilayer circuits, this technique is not adapted and the Damascene metallization methods, consisting in etching a pattern into a dielectric layer then filling it with metal, are preferred. These methods allowed in particular the use of copper for interconnections and thus, a relative reduction in propagation delay.

In the circuits with several levels of metallization, holes, with a high form factor, are made into the insulating layers in order to form via and thus to connect the upper and lower interconnection lines. In a traditional way, the openings of the via can be carried out by dry etching, in particular by plasma, by wet etching or laser ablation.

In the field of organic electronics, the patterns made from conducting material and the via can be made with these microelectronic techniques. Nevertheless, these techniques are expensive and their compatibility with organic materials remains limited. For example, the removal of the resin used in photolithography can cause a delamination of organic materials layers. In addition, problems of parallelism and verticality of the hole sides remains with these techniques.

The dielectric material separating the interconnections in flexible electronics is generally organic and cannot be etched by a so-called "hard" etching traditionally used in microelectronics. New techniques, adapted to organic electronics, have thus been considered.

A first method for making vias is proposed by Kawase et al. ("Inkjet Printed Via-Hole Interconnections and Resistors for All-Polymer Transistor Circuits", Adv. Mater. 2001, 13, No. 21). Initially, an organic material is deposited by liquid way, by ink jet impression for example. The opening corresponding to the via is formed through the organic material by the controlled projection of solvent drops. The solvent is selected so as to locally dissolve the organic material of the layer to be etched. By ejecting the solvent drops at the same site, a hole is gradually made, as well as a flange at the periphery of the hole. This flange is detrimental to the quality of the stack.

OBJECT OF THE INVENTION

The object of the invention is a method for making holes into a layer, which is rapid, easy to implement and which remedy for the disadvantages of the prior art.

More particularly, the object of the invention is a method allowing to make holes with a high form factor and compatible with organic materials.

According to the invention, these objects tend to be satisfied by the fact that the method comprises the provision of first and second adhesion areas on a surface of a support. The first area has dimensions corresponding to the dimensions of the hole. The method comprises the deposition of a layer onto the first and second areas, the material of the layer having an adhesion coefficient to the first area which is lower than the adhesion coefficient to the second area, and the elimination of the part of the layer on the first area with a fluid jet.

BRIEF DESCRIPTION OF THE DRAWINGS

Other advantages and characteristics will more clearly arise from the following description of particular embodiments of the invention given as nonrestrictive examples and represented in the annexed drawings, in which.

DESCRIPTION OF PARTICULAR EMBODIMENTS

Figure 1:
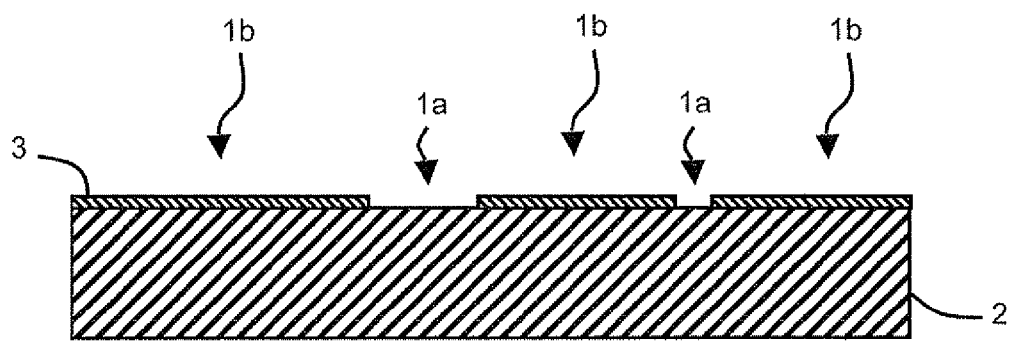
FIG. 1 represents a step of a method for making holes according to the invention.

FIG. 1 represents a first step of a method for making holes into a layer made from a dielectric material. A first adhesion area 1a and a second adhesion area 1b are formed on a surface of a support 2. The support 2 can be a substrate whose surface comprises a plurality of first and second adhesion areas 1a and 1b. For example in FIG. 1, the support 2 comprises two adhesion areas 1a and three adhesion areas 1b.

The support 2 is preferably a flexible substrate. The support 2 can be made from plastic, for example polyethylene naphthalate (PEN) or polyethylene terephthalate (PET). The support 2 can also be made from thinned silicon, from metal such as flexible steel or stainless steel, or from plastic covered with metal. The metal used to cover the substrate is for example aluminum or gold.

The first and second adhesion areas 1a and 1b are preferably formed by the localized deposition of an adhesion agent in the form of a thin layer. This adhesion agent is able to be fixed onto the surface of the support 2. Thus, an adhesion layer 3 is deposited onto regions of the upper face of the support 2 in order to form the areas 1a and 1b. The layer 3 can be deposited in the first areas 1a or in the second areas 1b. For example in FIG. 1, the layer 3 forms the second adhesion areas 1b and the regions of the surface of the support 2 not covered by the layer 3 form the first adhesion areas 1a. Conversely, the first areas 1a can be formed by the deposition of the adhesion layer 3.

The adhesion layer 3 is preferably a self-assembled monolayer SAM which can be deposited onto a metal layer. The self-assembled monolayers generally comprise bifunctional molecules, i.e. with two chemical groups. The first group, so-called head group, is fixed to the support 2. The second group, so-called tail group, binds closely to another material. Thus, thanks to the SAM layer, a material is hooked to the support. The nature of the SAM is selected according to the nature of the support 2 and the material it is desired to make adhere. For example, the thiol head groups (HS) bind to a gold surface in order to form a thiolate bond (S—Au). The SAMs including this type of group are preferably used with supports covered with gold. The adhesion layer 3 comprises, for example, a SAM of trimethylsilyl propanthiol and has a thickness lower than 10 nm. The adhesion layer 3 is preferably deposited by ink jet impression. Conversely, the SAM can decrease the adhesion of the material on the support, for example, with fluorinated tail groups (in particular fluoropropanthiol) in order to form the first areas with a lower adhesion. There is other SAMs which bind directly to plastic supports, for example trimethoxysilane, in order to increase the adhesion of the material deposited onto the support, or fluorosilane in order to decrease its adhesion.

The adhesion layer 3 can also be a metal layer. In the case of a support 2 made from plastic covered with metal, the metal adhesive layer 3 is selected among materials different from the material covering the support.

The adhesion can be modified by various localized surface treatments, for example, by plasma, UV exposition, ozone, laser.

Figure 2:
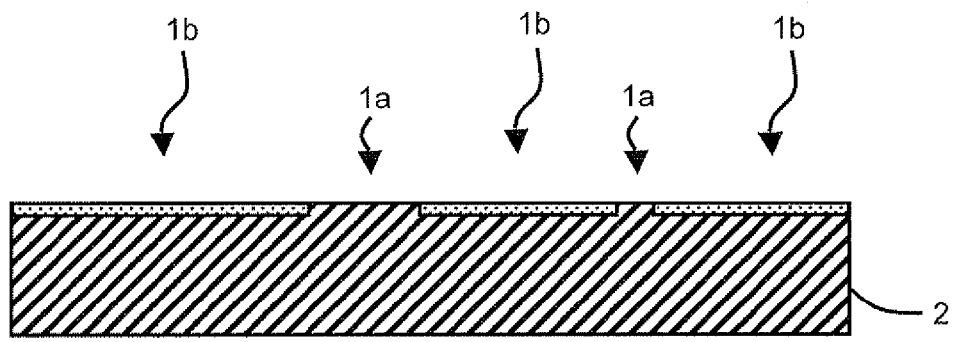
FIG. 2 represents a step of a variant of a method according to the invention, corresponding at the step in FIG. 1, FIGS. 3 to 5 represent steps of a method according to the invention.

FIG. 2 represents an alternative embodiment of the step of formation of the first and second adhesion areas. The upper face of the support 2 can be textured in order to modify the surface parameters. According to the structuring form, the roughness of certain areas can be decreased or increased, thus creating areas more or less adherent.

Figure 3:
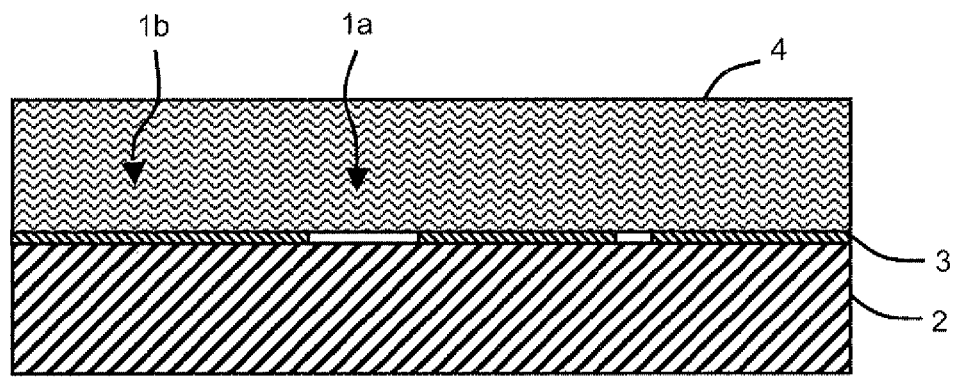

FIG. 3 represents the deposition of a dielectric material layer 4 on the first and second adhesion areas 1a and 1b. The adhesion coefficient of the dielectric material to the first areas 1a is lower than the adhesion coefficient to the second areas 1b. When SAMs are used, the dielectric material binds closely to the tail groups of the layer 3 in the second adhesion areas 1b, whereas the dielectric material 4 badly adheres in the first areas 1a not covered by the layer 3. The dielectric material is preferably deposited onto all the surface of the support by spin coating. The thickness of the dielectric material layer 4 varies between 500 nm and 10 µm. The dielectric material is preferably an organic material. This organic material is selected for example among styrenes (polystyrene), acrylates (polymethylmetacrylate, PMMA), polyimides, polyvinyl cinnamate and polyvinylpyrrolidane.

Each first adhesion area 1a is defined relative to the hole that is desired to make into the previously-deposited dielectric layer 4. Thus, the dimensions of the first area correspond to the dimensions of the hole.

Figure 4:
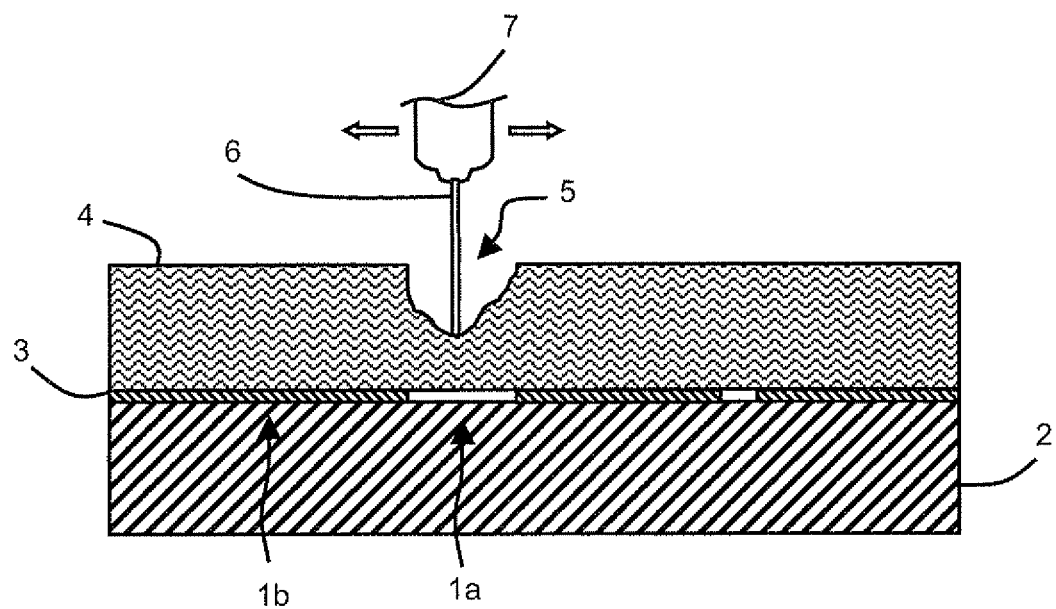

FIG. 4 represents a step of eliminating the dielectric material layer 4 in the first areas 1a in order to make holes 5. The removal of the dielectric material can be carried out by a fluid jet 6. The fluid jet scans the surface of the layer 4 and preferentially pulls out the dielectric material in the areas not having adhered to the support 2, i.e. in the first adhesion areas 1a.

The fluid jet 6 is preferably directed substantially perpendicular to the upper face of the dielectric layer 4. It seems that the local tearing of the material is favored by the fact that the jet induces, in these areas, vibrations of high energy causing an early fatigue of the dielectric material.

Figure 5:
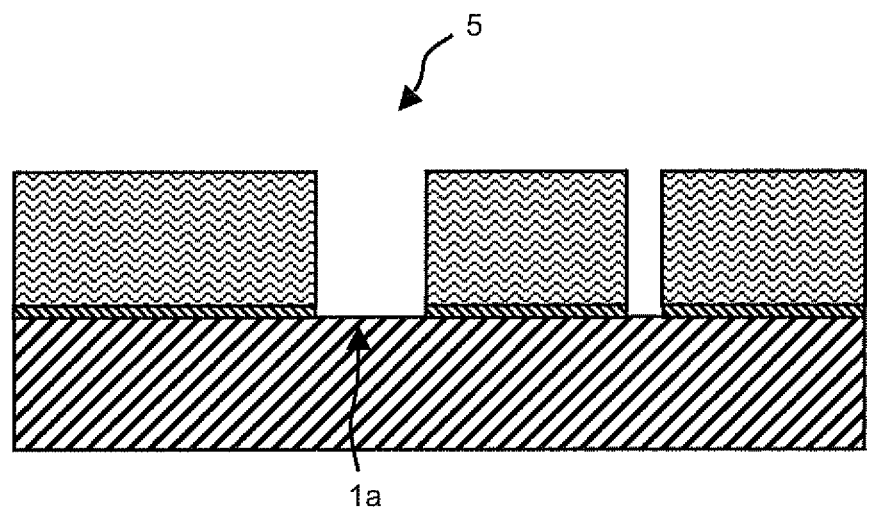

FIG. 5 represents the final structure after the elimination step shown in FIG. 4. Each hole 5 made is self-aligned with a first area 1a. In FIG. 5, the hole 5 obtained has dimensions which can be comprised between 100 nm and 1 µm in the width (or diameter) direction and between 500 nm and 10 µm in the height direction. The form factor, i.e. the ratio of height to width, can exceed two, even ten. The edges of the holes 5 remain clean.

Thus, the method described allows the formation of holes with a high form factor. The resolution of the patterns can be increased by decreasing the width of the fluid jet 6, by changing the nozzle 7 for example (FIG. 4). The maximum resolution is in the micrometric range. The method is easily reproducible and can be adapted to any type of materials. It thus avoids the use of glass masks in the case of a curing under ultraviolet rays and the associated problems of misalignment.

Lastly, the chemical developer traditionally used in photolithography is replaced by a simple fluid jet.

In the case of multilayered circuits, the support 2 is replaced by a lower layer in the stack. The fluid jet 6 does not damage this lower layer.

The equipment used in the elimination step is classically used in microelectronics for cleaning particles. It comprises a rotary support for receiving substrates and a hinged arm (not represented). It also comprises a nozzle 7 with a diameter of approximately 30 µm. The nozzle 7 is supplied with a fluid under pressure, preferably distilled water. The fluid under pressure can also be an acid, a base, a solvent or a gas (nitrogen, oxygen, argon).

The operating conditions of this equipment were adapted for the purposes of the method. Thus, the nozzle 7 is arranged at a distance of about ten millimeters from the upper face of the dielectric layer 4. The pressure of the fluid varies between 100 bars and 200 bars. The fluid jet is advantageously reduced in order to drill finer patterns. Thus, the pumped flow rate as well as the consumption in fluid are less important.

In a preferred embodiment, the dielectric material is organic and cross-linkable. The method then comprises a curing step before the dielectric material elimination step in the first areas 1a. This step of curing the layer 4 favors the bond between the support 2 and the layer 4 via the adhesion layer 3 and/or accelerates the phenomenon of fatigue in the areas which do not adhere. According to the ratio of the adhesion values between two surfaces, the curing step can be also carried out after etching the hole. The dielectric material is for example a polymer that can be cross-linked under ultraviolet rays such as polyvinyl cinnamate and polyvinylpyrrolidane.

Many variants and modifications of the method described here will appear to the man skilled in the art. The method has been described for the formation of via in a dielectric material. It is not excluded to use this technique for making holes into a layer of any material for other applications.

The invention claimed is:

1. A method for making a hole into a layer comprising the following steps:
   providing first and second adhesion areas on a surface of a support, the first area having dimensions corresponding to the dimensions of the hole,
   depositing the layer on the first and second areas, a material of the layer having an adhesion coefficient to the first area lower than the adhesion coefficient to the second area,
   eliminating a part of the layer on the first area with a jet fluid.

2. The method according to claim 1, wherein the part of the layer on the first area is eliminated by scanning the surface of the layer with the jet fluid.

3. The method according to claim 1, wherein the material of the layer is a dielectric material.

4. The method according to claim 1, wherein the material of the layer is organic, the method further comprising a step of curing the material of the layer before the elimination step.

5. The method according to claim 4, wherein the material of the layer is cross-linkable under ultraviolet rays.

6. The method according to claim 1, wherein the first and second adhesion areas are formed by a localized deposition of an adhesion layer.

7. The method according to claim 6, wherein the adhesion layer is a self-assembled monolayer.

8. The method according to claim 6, wherein the adhesion layer is a metal layer.

* * * * *